US011211930B2

(12) United States Patent
Morii et al.

(10) Patent No.: US 11,211,930 B2
(45) Date of Patent: *Dec. 28, 2021

(54) DRIVE CIRCUIT AND IMPEDANCE MATCHING DEVICE

(71) Applicant: DAIHEN Corporation, Osaka (JP)

(72) Inventors: Tatsuya Morii, Osaka (JP); Masayuki Nakahama, Osaka (JP)

(73) Assignee: DAIHEN Corporation, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/022,474

(22) Filed: Sep. 16, 2020

(65) Prior Publication Data

US 2020/0412364 A1 Dec. 31, 2020

Related U.S. Application Data

(63) Continuation of application No. 16/461,239, filed as application No. PCT/JP2017/041328 on Nov. 16, 2017, now Pat. No. 10,812,071.

(30) Foreign Application Priority Data

Nov. 17, 2016 (JP) .................................. 2016-223957

(51) Int. Cl.
*H03K 17/74* (2006.01)
*H01J 37/32* (2006.01)
(Continued)

(52) U.S. Cl.
CPC ........ *H03K 17/74* (2013.01); *H01J 37/32183* (2013.01); *H03H 7/01* (2013.01);
(Continued)

(58) Field of Classification Search
CPC ....... H01J 37/32183; H03H 7/38; H03H 7/40; H03H 11/30; H03H 7/0123; H03K 7/74
See application file for complete search history.

(56) References Cited

U.S. PATENT DOCUMENTS

| 4,196,381 A | 4/1980 | Standing |
| 4,251,742 A | 2/1981 | Beelitz |

(Continued)

FOREIGN PATENT DOCUMENTS

| JP | S58-106902 A | 6/1983 |
| JP | H4-200012 A | 7/1992 |

(Continued)

OTHER PUBLICATIONS

Examination Report for Taiwan Application No. 106139887 dated Feb. 22, 2021, with its English translation, 7 pages.

(Continued)

*Primary Examiner* — Hai L Nguyen
(74) *Attorney, Agent, or Firm* — Bret E. Field; Bozicevic, Field & Francis LLP

(57) ABSTRACT

A drive circuit performs switching between an on-state and an off-state of a PIN diode, the drive circuit being provided with a switching element and a switching element, a drive power supply, and a current limiting resistor that adjusts a forward current of the PIN diode. When the switching element is in an on-state and the switching element is in an off-state, the PIN diode is switched to the on-state by applying a forward voltage to the PIN diode from the drive power supply via the current limiting resistor, and when the switching element is in the off-state and the switching element is in the on-state, the PIN diode is switched to the off-state by applying, not via the current limiting resistor, a reverse voltage to the PIN diode from the drive power supply.

14 Claims, 6 Drawing Sheets

(51) Int. Cl.
- *H03H 7/01* (2006.01)
- *H03H 11/30* (2006.01)
- *H05H 1/46* (2006.01)
- *H03H 7/40* (2006.01)

(52) U.S. Cl.
CPC ............ *H03H 7/0115* (2013.01); *H03H 7/40* (2013.01); *H03H 11/30* (2013.01); *H05H 1/46* (2013.01)

(56) References Cited

U.S. PATENT DOCUMENTS

| | | | |
|---|---|---|---|
| 4,253,035 A | 2/1981 | Amitay | |
| 4,533,838 A | 8/1985 | Fujita | |
| 6,271,727 B1 | 8/2001 | Schmukler | |
| 6,677,828 B1 | 1/2004 | Harnett et al. | |
| 7,251,121 B2 | 7/2007 | Bhutta | |
| 7,298,128 B2 | 11/2007 | Bhutta | |
| 9,048,840 B2 | 6/2015 | Liu et al. | |
| 9,196,459 B2 | 11/2015 | Bhutta | |
| 9,306,533 B1 | 4/2016 | Mavretic | |
| 9,345,122 B2 | 5/2016 | Bhutta | |
| 9,496,122 B1 | 11/2016 | Bhutta | |
| 9,525,412 B2 | 12/2016 | Mavretic | |
| 9,543,122 B2 | 1/2017 | Bhutta | |
| 9,584,090 B2 | 2/2017 | Mavretic | |
| 9,591,739 B2 | 3/2017 | Bhutta | |
| 9,697,991 B2 | 7/2017 | Bhutta | |
| 9,728,378 B2 | 8/2017 | Bhutta et al. | |
| 9,729,122 B2 | 8/2017 | Mavretic | |
| 9,745,660 B2 | 8/2017 | Bhutta | |
| 9,755,641 B1 | 9/2017 | Bhutta | |
| 9,844,127 B2 | 12/2017 | Bhutta | |
| 9,865,432 B1 | 1/2018 | Bhutta | |
| 10,026,594 B2 | 7/2018 | Bhutta | |
| 10,110,218 B2 | 10/2018 | Foley et al. | |
| 10,217,608 B2 | 2/2019 | Mavretic | |
| 10,340,879 B2 | 7/2019 | Mavretic et al. | |
| 10,431,424 B2 | 10/2019 | Mavretic et al. | |
| 10,431,428 B2 | 10/2019 | Bhutta et al. | |
| 10,454,453 B2 | 10/2019 | Bhutta et al. | |
| 10,455,729 B2 | 10/2019 | Bhutta | |
| 10,460,912 B2 | 10/2019 | Bhutta et al. | |
| 10,483,090 B2 | 11/2019 | Bhutta et al. | |
| 10,778,209 B1 * | 9/2020 | Morii | H03K 17/04123 |
| 10,812,071 B2 * | 10/2020 | Morii | H01J 37/32183 |
| 10,985,735 B2 * | 4/2021 | Morii | H03H 7/40 |
| 2016/0065207 A1 | 3/2016 | Bhutta | |
| 2016/0380610 A1 | 12/2016 | Ulrich | |
| 2017/0178865 A1 | 6/2017 | Ulrich | |
| 2018/0234086 A1 | 8/2018 | Fields et al. | |
| 2019/0172683 A1 | 6/2019 | Mavretic et al. | |
| 2019/0267212 A1 | 8/2019 | Mavretic | |
| 2019/0272978 A1 | 9/2019 | Ahmed et al. | |
| 2019/0326094 A1 | 10/2019 | Bhutta | |

FOREIGN PATENT DOCUMENTS

| | | |
|---|---|---|
| JP | 2002-164762 A | 6/2002 |
| JP | 2003-110407 A | 4/2003 |
| JP | 5050062 B2 | 10/2012 |

OTHER PUBLICATIONS

English Translation of International Search Report for PCT/JP2017/041328 dated Feb. 6, 2018, 2 pages.

* cited by examiner

DRIVE CIRCUIT AND IMPEDANCE MATCHING DEVICE

CROSS-REFERENCE TO RELATED APPLICATIONS

This application is a continuation of U.S. patent application Ser. No. 16/461,239 filed May 15, 2019, which application is the national phase under 35 U. S. C. § 371 of PCT International Application No. PCT/JP2017/041328 which has an International filing date of Nov. 16, 2017 and designated the United States of America, the disclosure of which is herein incorporated by reference.

FIELD

The present disclosure relates to a drive circuit for switching between an on-state and an off-state of a PIN diode, and an impedance matching device using the drive circuit.

BACKGROUND

The diode has a characteristic that it becomes in a conductive state (on-state) when a forward voltage is applied and becomes in an open state (off-state) when a reverse voltage is applied.

Using this characteristic, a diode may be used as a switch. As such a diode, for example, a PIN diode is used. Japanese Patent Laid-Open Publication No. 2003-110407 discloses an example of a drive circuit that switches between an on-state and an off-state of a conventional PIN diode. The drive circuit disclosed in this document has two switching elements, a bias power supply +VD is supplied to an output terminal of the drive circuit when the switching element disposed on a positive side of a power supply is in the on-state, and the bias power supply -VS is supplied to the output terminal of the drive circuit when the switching element disposed on a negative electrode side of the power supply is in the on-state. The output terminal is connected to an input terminal of the PIN diode, and when the bias power supply +VD is supplied to the input terminal, a forward voltage is applied to the PIN diode to turn on the PIN diode. On the other hand, when the bias power supply -VS is supplied to the input terminal, a reverse voltage is applied to the PIN diode, to turn off the PIN diode.

SUMMARY

In the Japanese Patent Laid-Open Publication No. 2003-110407, the PIN diode is connected to a power supply line connecting a high-frequency input unit and a high-frequency output unit, and switching between the on-state and the off-state of the PIN diode is performed in a state where high-frequency current flows. The switching in such a conduction state is called a "hot switching." Particularly, as described in the Japanese Patent Laid-Open Publication No. 2003-110407, in hot switching in a state where a high-frequency current flows, switching time from the on-state to the off-state of the PIN diode is long (switching speed is slow), that is, when a transition time of carriers of the PIN diode is long, power loss becomes large. Due to this power loss, for example, there was a problem in which an amount of heat generated by the PIN diode increases, thus reducing a reliability of the PIN diode. Therefore, when switching the PIN diode from the on-state to the off-state, it was necessary to perform the switching with a shorter transition time.

In order to solve such a problem, a drive circuit disclosed in Japanese Patent No. 5050062 includes a bootstrap circuit, a clamp network, and the like, and adjusts the switching speed. However, since the bootstrap circuit, the clamp network and the like are used, circuit configuration and control are complicated.

Therefore, the present disclosure has been made in view of the aforementioned problems, and it is therefore an object of the present disclosure to provide a drive circuit capable of suppressing a reduction in reliability of a PIN diode due to hot switching with a simple circuit configuration, and to provide an impedance matching device using the drive circuit.

A drive circuit provided by an aspect of the present disclosure is a drive circuit for switching between an on-state and an off-state of a PIN diode, the drive circuit comprising: a first switching element and a second switching element, one of the first switching element and the second switching element being in an off-state when the other is in an on-state; a drive power supply that generates a DC voltage; and a current-limiting resistor that adjusts a forward current of the PIN diode, wherein when the first switching element is in the on-state and the second switching element is in the off-state, a forward voltage is applied from the drive power supply to the PIN diode via the current-limiting resistor to turn on the PIN diode, and wherein when the first switching element is in the off-state and the second switching element is in the on-state, a reverse voltage is applied not via the current-limiting resistor to the PIN diode from the drive power supply to turn off the PIN diode. According to this configuration, when switching the PIN diode from the on-state to the off-state, since a reverse voltage is applied to the PIN diode not via a current-limiting resistor, the PIN diode may be switched to the off-state in a short transition time. As a result, the amount of heat generated by the PIN diode can be suppressed. Therefore, deterioration of the reliability of the PIN diode due to hot switching can be suppressed.

In a preferred embodiment of the drive circuit, an on-resistance of the second switching element is 0.1Ω or less. According to this configuration, since a resistance value in a current path when the PIN diode is changed from the on-state to the off-state is low, the transition time from the on-state to the off-state of the PIN diode can be further shortened.

In a preferred embodiment of the drive circuit, the forward current of the PIN diode generated by the forward voltage is determined by an on-resistance of the first switching element and the current-limiting resistor, and wherein a resistance value of the current-limiting resistor is determined based on the on-resistance of the first switching element so that the forward current of the PIN diode has a predetermined current value. According to this configuration, the forward current is set to be a predetermined current value (for example, 1 A or more), whereby the PIN diode may be switched from the off-state to the on-state with a transition time sufficiently shorter than a carrier lifetime of the PIN diode.

In a preferred embodiment of the drive circuit, the first switching element, the current-limiting resistor, and the second switching element are connected in series in this order from a positive electrode terminal to a negative electrode terminal of the drive power supply, and wherein an anode terminal of the PIN diode is connected to a node between the current-limiting resistor and the second switching element and a cathode terminal of the PIN diode is grounded. According to this configuration, when the first switching element is in the on-state and the second switching element is in the off-state, the forward voltage is applied to the PIN diode via the current-limiting resistor, while when the first switching element is in the off-state and the second switching element is in the on-state, the reverse voltage can be applied to the PIN diode not via the current-limiting resistor. Therefore, in the current path when the PIN diode is changed from the on-state to the off-state, it is possible not to pass the current-limiting resistor.

In a preferred embodiment of the drive circuit, the current-limiting resistor, the first switching element, and the second switching element are connected in series in this order from a positive electrode terminal to a negative electrode terminal of the drive power supply, and wherein an anode terminal of the PIN diode is connected to a node between the first switching element and the second switching element and a cathode terminal of the PIN diode is grounded. With this configuration as well, in the current path when the PIN diode is changed from the on-state to the off-state, it is possible not to pass the current-limiting resistor.

In a preferred embodiment of the drive circuit, the second switching element, the current-limiting resistor, and the first switching element are connected in series in this order from a positive electrode terminal to a negative electrode terminal of the drive power supply, and wherein an anode terminal of the PIN diode is grounded and a cathode terminal of the PIN diode is connected to a node between the current-limiting resistor and the second switching element. With this configuration as well, in the current path when the PIN diode is changed from the on-state to the off state, it is possible not to pass the current-limiting resistor.

In a preferred embodiment of the drive circuit, the second switching element, the first switching element, and the current-limiting resistor are connected in series in this order from a positive electrode terminal to a negative electrode terminal of the drive power supply, and wherein an anode terminal of the PIN diode is grounded and a cathode terminal of the PIN diode is connected to a node between the first switching element and the second switching element. With this configuration as well, in the current path when the PIN diode is changed from the on-state to the off-state, it is possible not to pass the current-limiting resistor.

In a preferred embodiment of the drive circuit, a filter circuit is further provided between the node and the PIN diode. According to this configuration, since a high-frequency power is suppressed from being input to the first switching element and the second switching element by the filter circuit, it is possible to suppress the elements from being damaged.

In a preferred embodiment of the drive circuit, the drive circuit further comprises a speed-up capacitor connected in parallel to the current-limiting resistor. According to this configuration, when the first switching element is switched to the on-state and the second switching element is switched to the off-state, the current path through the speed-up capacitor is conducted. Therefore, since the PIN diode can be switched to the on-state by a large current, the PIN diode can be switched to the on-state with a short transition time.

An impedance matching device provided by a second aspect of the present disclosure is a impedance matching device arranged between a high-frequency power supply and a load connected to each other by a power supply line, the device comprising: a plurality of impedance adjustment capacitors connected in parallel and each having one end connected to the power supply line; a plurality of PIN diodes connected in series one by one to corresponding ones of the plurality of impedance adjustment capacitors; a plurality of drive circuits according to any one of claims 1 to 9 respectively connected to corresponding ones of the plurality of PIN diodes; a detection unit that detects a load-side impedance seen from an output end of the high-frequency power supply; and a control circuit that inputs a drive signal for switching between an on-state and an off-state of the first switching element and the second switching element to each of the plurality of drive circuits based on the load-side impedance. According to this configuration, since the impedance adjustment capacitor connected to the PIN diode which is in the on-state becomes effective by switching between the on-state and the off-state of the PIN diode, it is possible to change the capacitance of the impedance matching device. As a result, it is possible to adjust load-side impedance and perform impedance matching. In addition, since the transition time of switching of the PIN diode from the on-state to the off-state is short, speed of the impedance matching is improved. Therefore, it is possible to efficiently supply the high-frequency power from the high-frequency power supply to the load.

Effect of Invention

According to the present disclosure, when the PIN diode is switched from the on-state to the off-state, a reverse voltage is applied not via the current-limiting resistor to the PIN diode. Thus, with a simple configuration, the PIN diode can be switched from the on-state to the off-state with a short transition time. Therefore, deterioration of the reliability of the PIN diode due to hot switching can be suppressed.

The above and further objects and features will more fully be apparent from the following detailed description with accompanying drawings.

DETAILED DESCRIPTION

Preferred embodiments of the present disclosure will be described below with reference to the drawings.

Figure 1:
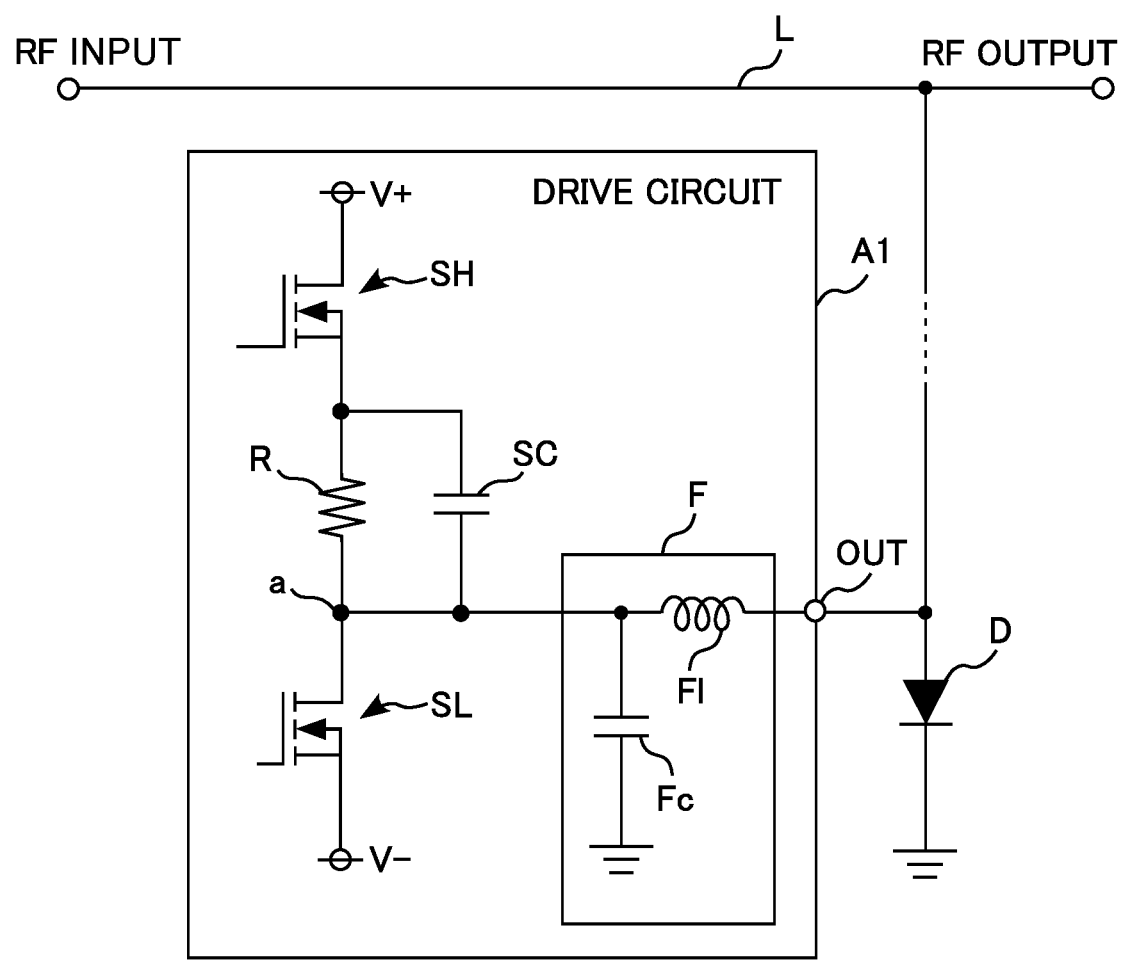
FIG. 1 is a circuit configuration diagram illustrating a drive circuit according to a first embodiment.

FIG. 1 illustrates a circuit configuration of a drive circuit A1 of a PIN diode D according to a first embodiment. The drive circuit A1 receives an input from a drive power supply (not illustrated) and applies a forward bias or a reverse bias to the PIN diode D via an output terminal OUT. An anode terminal of the PIN diode D is connected to the output terminal OUT of the drive circuit A1 and connected to a power supply line L through which a high-frequency current flows. A cathode terminal of the PIN diode D is grounded. Further, the drive power supply is a DC voltage supply and has a positive electrode terminal V+ and a negative electrode terminal V−. The positive electrode terminal V+ applies a forward voltage drop (a voltage required to allow a forward current to flow) to an anode terminal of the PIN diode D when a switching element SH to be described later is in the on-state and a switching element SL to be described later is in the off-state to turn on the PIN diode D. Further, an negative electrode terminal V− is for applying a negative voltage (a voltage in a range not reaching a breakdown voltage) to the anode terminal of the PIN diode D to turn off the PIN diode D when the switching element SL is in the on-state and the switching element SH is in the off-state.

The drive circuit A1 applies a forward voltage to the PIN diode D via the output terminal OUT to bring the PIN diode D into a conductance state (on-state), and applies a reverse voltage to the PIN diode D to bring the PIN diode D in an open state (off-state).

As illustrated in FIG. 1, the drive circuit A1 includes two switching elements SH and SL, a current-limiting resistor R, a speed-up capacitor SC, and a filter circuit F.

The switching elements SH and SL are circuit elements made of semiconductors and are, for example, metal oxide semiconductor field effect transistor (MOSFET), bipolar transistor, insulated gate bipolar transistor (IGBT), optocoupler and the like. In the present embodiment, an example in which an N-channel MOSFET is used as the switching elements SH and SL will be described as an example, but the present disclosure is not limited thereto.

In the switching elements SH and SL, a drive signal is input from a control circuit (not illustrated) to the gate terminal, and the on-state and the off-state are switched in accordance with the drive signal. The switching elements SH and SL are controlled such that when one of them is in the on-state, the other is in the off-state by the drive signal. For example, the control circuit generates two voltage signals whose high levels and the low levels are mutually inverted, inputs one of the voltage signals as a drive signal S1 to the switching element SH, and inputs the other of the voltage signals as a drive signal /S1 to a switching element SL. In a case where the drive signal S1 (/S1) is a high-level voltage signal, the switching element SH (SL) is turned on, and in a case where the drive signal S1 (/S1) is a low-level voltage signal, the switching element SH (SL) is turned off. As a result, the on-states and the off-states of the switching element SH and the switching element SL are opposite to each other. In the present embodiment, the switching element SH corresponds to a "first switching element" recited in the claims, and the switching element SL corresponds to a "second switching element" recited in the claims.

In the drive circuit A1, the switching elements SH and SL are connected in series via a current-limiting resistor R. The switching element SH is connected to the positive electrode side of the drive power supply and the switching element SL is connected to the negative electrode side of the drive power supply. Therefore, in the drive circuit A1, the switching element SH (first switching element), the current-limiting resistor R, and the switching element SL (second switching element) connected in series in this order from the positive electrode terminal V+ to the negative electrode terminal V− of the drive power supply. Specifically, a drain terminal of the switching element SH is connected to the positive electrode terminal V+ of the drive power supply, and a source terminal of the switching element SH is connected to one end of the current-limiting resistor R. Further, a drain terminal of the switching element SL is connected to the other end of the current-limiting resistor R, and a source terminal of the switching element SL is connected to the negative electrode terminal V− of the drive power supply.

The gate terminals of the switching elements SH and SL are connected to the control circuit.

In addition, a speed-up capacitor SC is connected in parallel to the current-limiting resistor R. A node a between the current-limiting resistor R and the switching element SL is connected to the output terminal OUT via a filter circuit F. The filter circuit F is constituted by, for example, a capacitor Fc and an inductor F1 connected in an L shape. Specifically, one end of the inductor F1 and one end of the capacitor Fc are connected to the node a. The other end of the inductor F1 is connected to the output terminal OUT, and the other end of the capacitor Fc is grounded. The configuration of the filter circuit F is not limited thereto. It is not necessary to include the filter circuit F, but, in a case where the filter circuit F is included, a high-frequency power flowing through an RF input terminal and an RF output terminal may be suppressed from being input to the drive circuit A1, thus suppressing damages to the switching elements SH and SL.

The operation when the drive circuit A1 configured as described above switches between the on-state and the off-state of the PIN diode D will be described.

First, the operation when the PIN diode D is switched from the off-state to the on-state will be described.

When the switching element SH is switched to the on-state and the switching element SL is switched to the off-state when the PIN diode D is in the off-state, that is, the switching element SH is in the off-state and the switching element SL is in the on-state, a current path is conducted from the positive electrode terminal V+ of the drive power supply to the anode terminal of the PIN diode D via the switching element SH, the current-limiting resistor R or the speed-up capacitor SC, and the filter circuit F. As a result, a forward voltage is applied to the PIN diode D, and the PIN diode D is turned on. At this time, at the moment when the switching element SH is switched from the off-state to the on-state and the switching element SL is switched from the on-state to the off-state, a large forward current flows through the PIN diode D via the current path passing through the speed-up capacitor SC. Further, when charging of the speed-up capacitor SC is completed, a forward current flows via the current path passing through the current-limiting resistor R to the PIN diode D. The forward current is determined by the current-limiting resistor R and the on-resistance of the switching element SH. Here, it is possible to supply a sufficient forward current to the PIN diode D by setting the current-limiting resistor R so that the forward current becomes a predetermined current value (for example, 1 A or more). Thus, when the PIN diode D is switched from the off-state to the on-state, the switching can be performed with a transition time that is sufficiently shorter than a carrier lifetime of the PIN diode D.

Next, the operation when the PIN diode D is switched from the on-state to the off-state will be described.

When the switching element SH is switched to the off-state and the switching element SL is switched to the on-state when the PIN diode D is in the on-state, that is, the switching element SH is in the on-state and the switching element SL is in the off-state, a current path is conducted from the negative electrode terminal V− of the drive power supply to the anode terminal of the PIN diode D via the switching element SL and the filter circuit F. As a result, a reverse voltage is applied to the PIN diode D, and the PIN diode D is turned off. At this time, when the switching element SH is switched from the on-state to the off-state and the switching element SL is switched from the off-state to the on-state, current flows through the switching element SL not via the current-limiting resistor R or the speed-up capacitor SC. Therefore, since the transition time when the PIN diode D is switched from the on-state to the off-state is determined by an on-resistance of the switching element SL, the transition time may be made shorter than that in a case where the current-limiting resistor R is present. For example, when the switching element SL having a small on-resistance (for example, 0.1Ω or less) is used, the transition time may be shortened.

As described above, according to the drive circuit A1 according to the first embodiment, the PIN diode D may be switched from the on-state to the off-state with a short circuit time with a simple circuit configuration. Therefore, it is possible to suppress a loss such as heat generation of the PIN diode D and to suppress deterioration of a reliability of the PIN diode D by hot switching.

Figure 2:
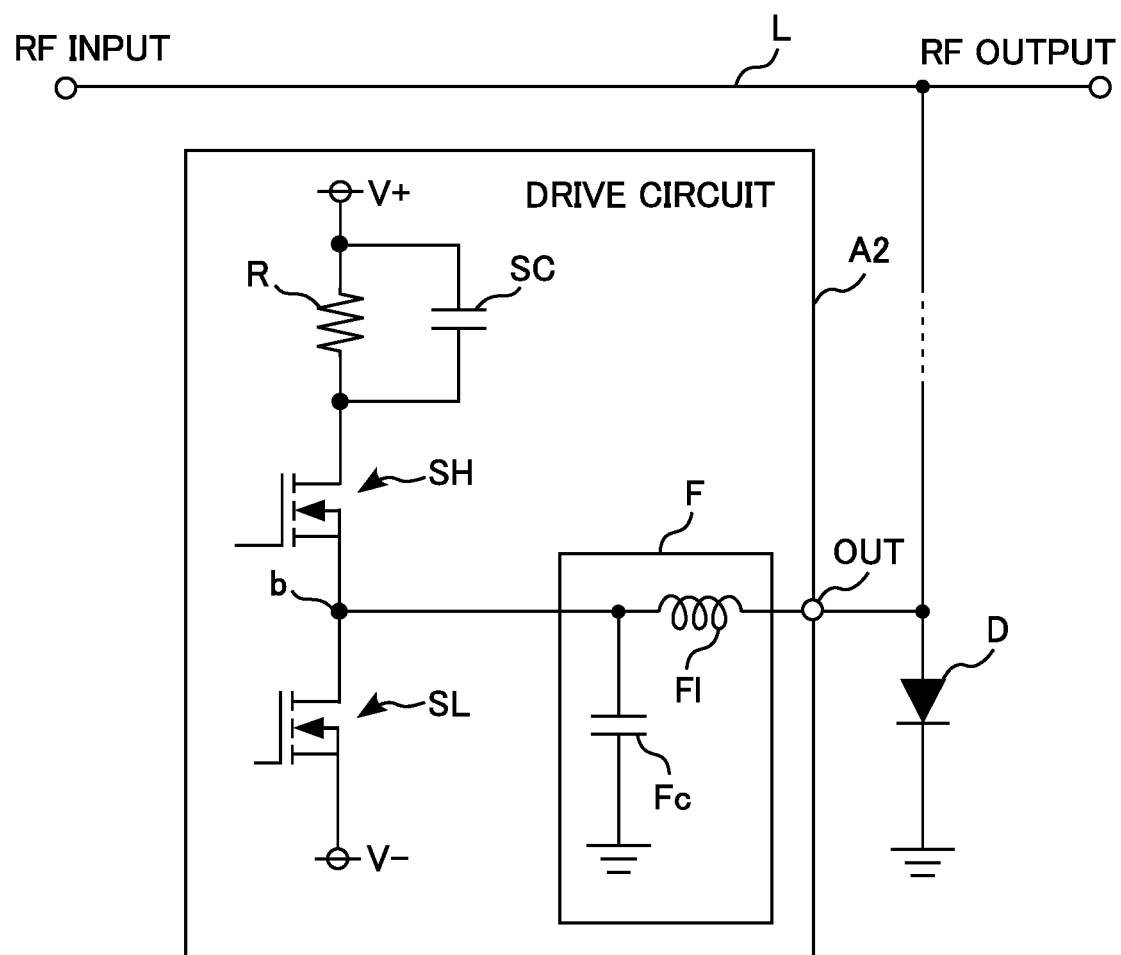
FIG. 2 is a circuit configuration diagram illustrating a drive circuit according to a second embodiment.

FIG. 2 illustrates a drive circuit A2 of the PIN diode D according to a second embodiment. The same or similar components as those of the drive circuit A1 are denoted by the same reference numerals, and description thereof is omitted. As illustrated in the figure, the drive circuit A2 of the second embodiment is different from the drive circuit A1 according to the first embodiment in a connection position of the current-limiting resistor R.

In the drive circuit A2, the current-limiting resistor R is connected between the switching element SH and the positive electrode terminal V+ of the drive power supply, and the switching element SH and the switching element SL are directly connected to each other. Therefore, in the drive circuit A2, the current-limiting resistor R, the switching element SH, and the switching element SL are connected in series in this order from the positive electrode terminal V+ to the negative electrode terminal V− of the drive power supply. Specifically, the positive electrode terminal V+ of the drive power supply and one end of the current-limiting resistor R are connected, and the other end of the current-limiting resistor R and a drain terminal of the switching element SH are connected. Further, a source terminal of the switching element SH and a drain terminal of the switching element SL are connected, and a source terminal of the switching element SL and the negative electrode terminal V− of the drive power supply are connected. A node b between the switching element SH and the switching element SL is connected to the output terminal OUT via a filter circuit F. Further, in this embodiment, the switching element SH corresponds to the "first switching element" recited in the claims and the switching element SL corresponds to the "second switching element" recited in the claims.

Since the drive circuit A2 configured as described above operates in the same manner as the drive circuit A1 according to the first embodiment, the same effect may be obtained.

Figure 3:
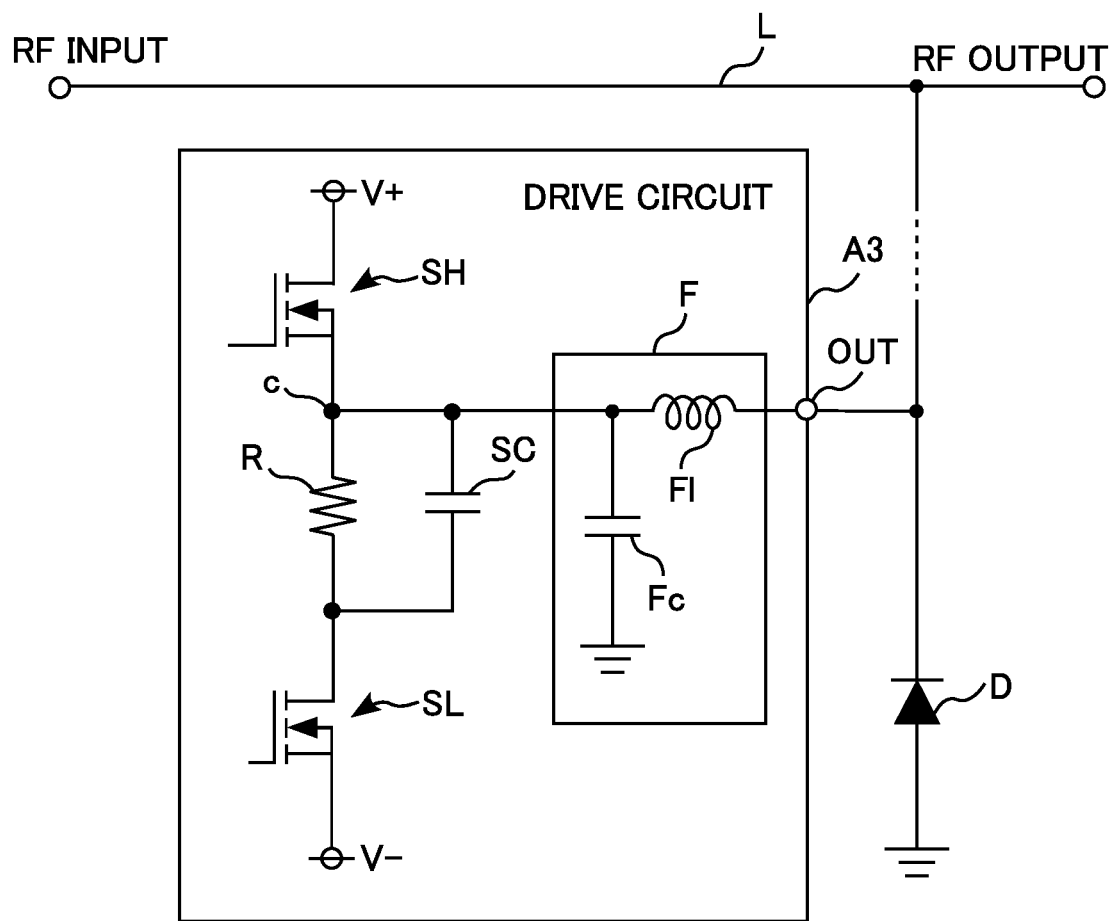
FIG. 3 is a circuit configuration diagram illustrating a drive circuit according to a third embodiment.

FIG. 3 illustrates a drive circuit A3 of a PIN diode D according to a third embodiment. The same reference numerals are given to the same or similar configurations as those of the drive circuits A1 and A2, and the description thereof will be omitted. The third embodiment differs from the first embodiment and the second embodiment in that connection directions of an anode terminal and a cathode terminal of the PIN diode D are opposite. Specifically, the anode terminal of the PIN diode D is grounded, and the cathode terminal of the PIN diode D is connected to a power supply line L connecting an RF input terminal and an RF output terminal. Further, an output terminal OUT of a drive circuit A3 is connected to the cathode terminal of the PIN diode D.

Further, the drive circuit A3 has a circuit configuration different from that of the drive circuit A1. More specifically, in the drive circuit A1, a node a between a switching element SL and a current-limiting resistor R is connected to the output terminal OUT via a filter circuit F, but in the drive circuit A3, a node c between a switching element SH and the current-limiting resistor R is connected to the output terminal OUT via the filter circuit F. In the present embodiment, the switching element SH corresponds to the "second switching element" recited in the claims and the switching element SL corresponds to the "first switching element" recited in the claims Therefore, in the drive circuit A3, the switching element SH (second switching element), the current-limiting resistor R, and the switching element SL (first switching element) are connected in series in this order from the positive electrode terminal V+ to the negative electrode terminal V− of the drive power supply.

The operation in which the PIN diode D is switched between the on-state and the off-state by the drive circuit A3 configured as described above will be described.

First, the operation in which the PIN diode D is switched from the off-state to the on-state will be described.

When the switching element SH is switched to the off-state and the switching element SL is switched to the on-state when the PIN diode D is in the off-state, that is, the switching element SH is in the on-state and the switching element SL is in the off-state, a current path from the negative electrode terminal V− of the drive power supply to the cathode terminal of the PIN diode D is conducted via the switching element SL, the current-limiting resistor R or the speed-up capacitor SC, and the filter circuit F. As a result, a forward voltage is applied to the PIN diode D, and the PIN diode D is turned on. At this time, at the moment when the switching element SH is switched from the on-state to the off-state and the switching element SL is switched from the off-state to the on-state, a large forward current flows through the current path via the speed-up capacitor SC to the PIN diode D. Further, when charging of the speed-up capacitor SC is completed, a forward current flows through the current path passing through the current-limiting resistor R to the PIN diode D. The forward current is determined by the current-limiting resistor R and the on-resistance of the switching element SL. Here, as in the first embodiment, the current-limiting resistor R is set so that the forward current becomes a predetermined current value (for example, 1 A or more), whereby a sufficient forward current can be supplied to the PIN diode D. Thus, when switching the PIN diode D from the off-state to the on-state, switching can be performed with the transition time that is sufficiently shorter than the carrier lifetime of the PIN diode D.

Next, the operation when the PIN diode D switches from the on-state to the off-state will be described.

When the switching element SH is switched to the on-state and the switching element SL is switched to the off-state when the PIN diode D is in the on-state, that is, the switching element SH is in the off-state and the switching element SL is in the on-state, a current path is conducted from the positive electrode terminal V+ of the drive power supply to the cathode terminal of the PIN diode D through the switching element SH and the filter circuit F. As a result, a reverse voltage is applied to the PIN diode D, and the PIN diode D is turned off. At this time, when the switching element SH is switched from the off-state to the on-state and the switching element SL is switched from the on-state to the off-state, the current flows through the switching element SH not via the current-limiting resistor R or the speed-up capacitor SC. Therefore, the transition time when the PIN diode D is switched from the on-state to the off-state is determined by the on-resistance of the switching element SH, so the transition time can be made shorter than that in a case where the current-limiting resistor R exists. For example, if the switching element SH having a small on-resistance (for example, 0.1Ω or less) is used, the transition time may be shortened.

As described above, according to the drive circuit A3 in the third embodiment, the PIN diode D may be switched from the on-state to the off-state with a short transition time using a simple circuit configuration. Therefore, it is possible to suppress a loss such as heat generation of the PIN diode D and to suppress deterioration of reliability of the PIN diode D by hot switching.

Figure 4:
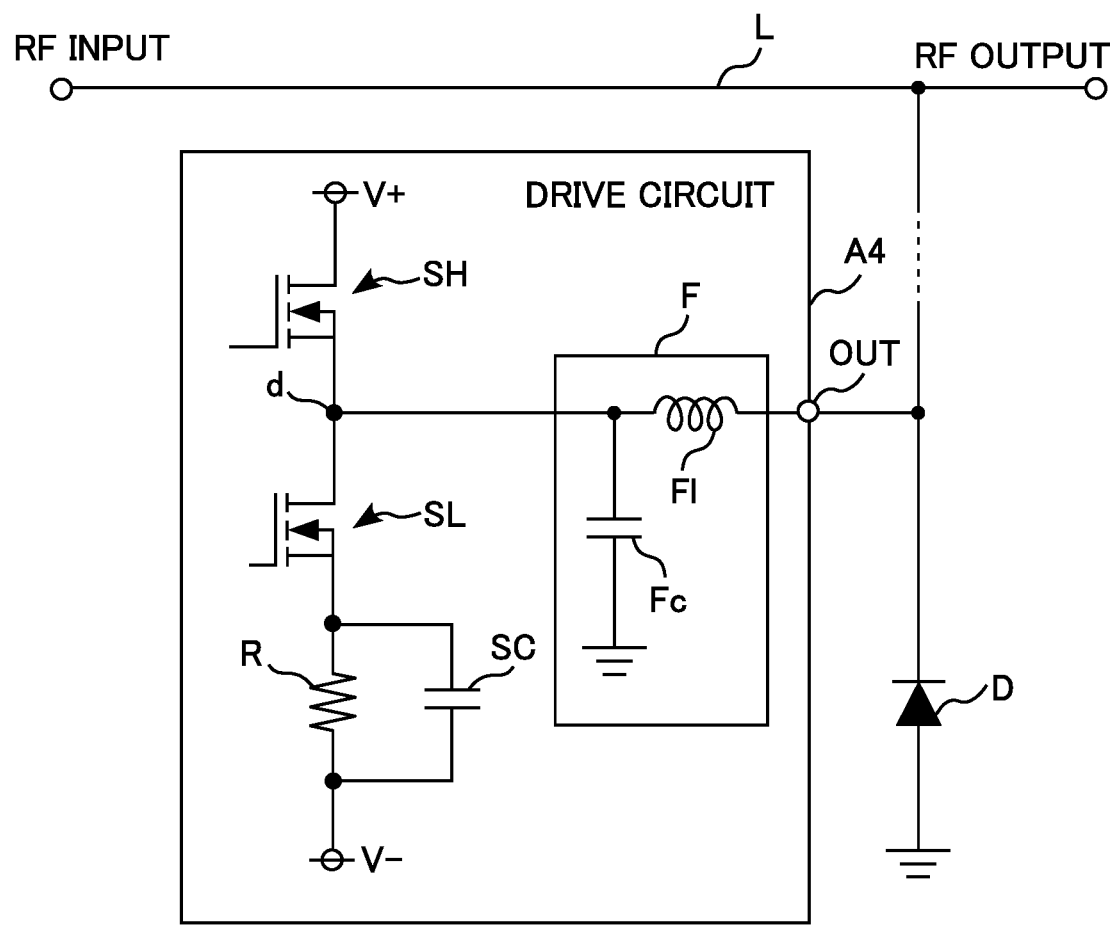
FIG. 4 is a circuit configuration diagram illustrating a drive circuit according to a fourth embodiment.

FIG. 4 illustrates a drive circuit A4 of a PIN diode D according to a fourth embodiment. The same reference numerals are given to the same or similar configurations as those of the drive circuits A1 to A3, and the description thereof will be omitted. As illustrated in the figure, the drive circuit A4 of the fourth embodiment is different from the drive circuit A3 of the third embodiment in the connection position of the current-limiting resistor R.

In the drive circuit A4, the current-limiting resistor R is connected between the switching element SL and the negative electrode terminal V− of the drive power supply, and the switching element SH and the switching element SL are directly connected. Therefore, in the drive circuit A4, the switching element SH (second switching element), the switching element SL (first switching element), and a current-limiting resistor R are connected in series in this order from the positive electrode terminal V+ to the output terminal V− on the negative side of the drive power supply. Specifically, the positive electrode terminal V+ of the drive power supply and a drain terminal of the switching element SH are connected to each other, and a source terminal of the switching element SH and a drain terminal of the switching element SL are connected to each other. Further, a source terminal of the switching element SL is connected to one end of the current-limiting resistor R, and the other end of the current-limiting resistor R is connected to the negative electrode terminal V− of the drive power supply. A node d between the source terminal of the switching element SH and the drain terminal of the switching element SL is connected to an output terminal OUT via a filter circuit F. Further, in the present embodiment, the switching element SH corresponds to the "second switching element" recited in the claims, and the switching element SL corresponds to the "first switching element" recited in the claims.

The drive circuit A4 configured as described above operates in the same manner as the drive circuit A3 according to the third embodiment, so that the same effect can be obtained.

The drive circuits A1 to A4 of the PIN diode D described above are used, for example, in an impedance matching device in a high-frequency power supply system. The high-frequency power supply system will be described below as a fifth embodiment of the present disclosure.

Figure 5:
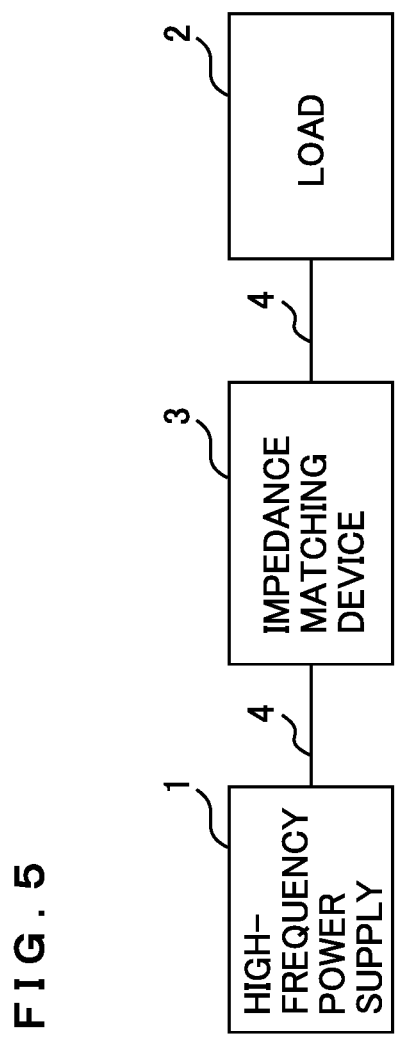
FIG. 5 is a diagram illustrating the overall configuration of a high-frequency power supply system according to a fifth embodiment.

FIG. 5 illustrates an example of an overall configuration of a high-frequency power supply system according to a fifth embodiment of the present disclosure. In the same figure, the high-frequency power supply system includes a high-frequency power supply 1, a load 2, and an impedance matching device 3. The high-frequency power supply 1 and the load 2 are connected by a power supply line 4, and an impedance matching device 3 is disposed between them. The high-frequency power supply system is a system that supplies high-frequency power generated by the high-frequency power supply 1 to the load 2 via the power supply line 4. The power supply line 4 corresponds to a power supply line L in FIGS. 1 to 4.

The high-frequency power supply 1 outputs the high-frequency power. The high-frequency power supply 1 converts an AC power from a power system into a DC power by a rectifier circuit, converts the DC power into the high-frequency power by an inverter circuit, and outputs it. In addition, the high-frequency power supply 1 includes a power supply control circuit (not illustrated), and controls the output power and the output current. In the present embodiment, the high-frequency power supply 1 outputs, for example, a high-frequency power of 13.56 MHz. A configuration and a frequency of the high-frequency power supply 1 are not limited.

The load 2 performs various processes using the high-frequency power input from the high-frequency power supply 1. An example of such a load 2 is a plasma processing apparatus, a plasma generation apparatus, or a contactless power transmission apparatus, or the like. For example, the plasma processing apparatus is a device that includes a workpiece processing unit and performs a process (for example, etching, CVD, etc.) on the workpiece such as a semiconductor wafer or a liquid crystal substrate carried into the work processing unit. In order to process the workpiece, the plasma processing apparatus introduces a plasma discharge gas into the workpiece processing unit and applies the high-frequency power (voltage) supplied from the high-frequency power supply 1 to the plasma discharge gas, thereby ionizing the plasma discharge gas to be brought into a plasma state from a non-plasma state. The plasma processing apparatus processes the workpiece by utilizing a gas in the plasma state. The plasma generation apparatus ionizes the plasma discharge gas to be brought into a plasma state from a non-plasma state, and supplies the gas in the plasma state to a plasma chamber or the like.

In the plasma processing apparatus, as a manufacturing process such as plasma etching and plasma CVD proceeds, the state of the plasma changes momentarily. As a result, an impedance of the load 2 varies. Therefore, in order to efficiently supply electric power from the high-frequency power supply 1 to the load 2, the high-frequency power supply system includes an impedance matching device 3 that adjust an impedance on the load 2 side seen from an output end of the high-frequency power supply 1 (hereinafter, referred to as a "load-side impedance") as the impedance of the load 2 varies.

The impedance matching device 3 performs an impedance matching by adjusting the load-side impedance. The impedance matching device 3 includes the drive circuit A1 and the PIN diode D according to the first embodiment.

Figure 6:
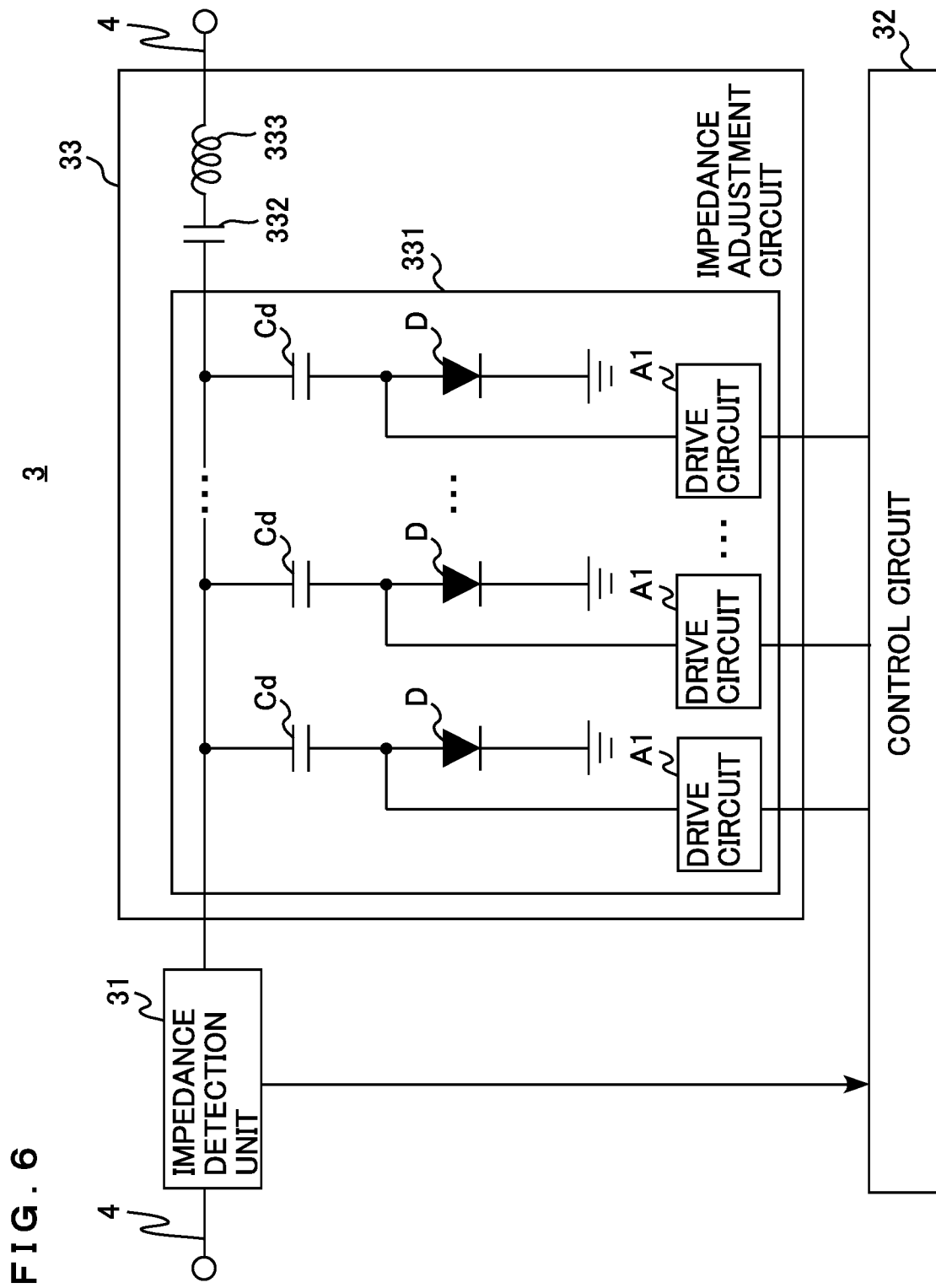
FIG. 6 is a diagram illustrating the configuration of an impedance matching device according to a fifth embodiment.

FIG. 6 illustrates an example of a detailed circuit configuration of the impedance matching device 3. In the same figure, the impedance matching device 3 includes an impedance detection unit 31, a control circuit 32, and an impedance adjustment circuit 33.

The impedance detection unit 31 is disposed at an input terminal of the impedance matching device 3 and detects the load-side impedance. The impedance detection unit 31 outputs the load-side impedance thus detected to a control circuit 32. Specifically, the impedance detection unit 31 detects a current corresponding to the high-frequency current flowing through the power supply line 4 and a voltage corresponding to the high-frequency voltage generated in the power supply line 4, and obtains a current effective value, a voltage effective value, and a phase difference between the current signal and the voltage signal from the current signal and the voltage signal thus detected. Then, the load-side impedance is calculated using these parameters, and the load-side impedance thus calculated is outputted to the control circuit 32. A configuration of the impedance detection unit 31 and a method of detecting the load-side impedance are not limited thereto.

The control circuit 32 controls the impedance adjustment circuit 33 so that the load-side impedance inputted from the impedance detection unit 31 becomes a predetermined impedance value (for example, the impedance when looking at the high-frequency power supply 1 from the output end of the high-frequency power supply 1).

The impedance adjustment circuit 33 includes a capacitance variation circuit 331, a fixed capacitor 332, and an inductor 333. The fixed capacitor 332 may not be included. The impedance adjustment circuit 33 changes capacitance of the capacitance variation circuit 331 and adjusts the load-side impedance.

The capacitance variation circuit 331 is configured to include a plurality of adjustment capacitors (impedance adjustment capacitors) Cd, a plurality of PIN diodes D, and a plurality of drive circuits A1, whereby the capacitance can be changed. In the capacitance variation circuit 331, one PIN diode D is connected in series to each adjustment capacitor Cd, and series bodies of the adjustment capacitor Cd and the PIN diode D connected in parallel to each other. One end of each adjustment capacitor Cd is connected to the power supply line 4, and the other end is connected to an anode terminal of each PIN diode D. In addition, a cathode terminal of each PIN diode D is grounded. The capacitances of the respective adjustment capacitors Cd are different from each other, and are set so as to increase, for example, in a binary step such as 1 pF, 2 pF, 4 pF, . . . . Capacitors having the same capacitance may be used.

Further, the capacitance of each adjustment capacitor Cd is not limited to the configuration in which all capacitances are different from each other or all the capacitances are the same. A plurality of adjustment capacitors Cd whose capacitance increases, for example, in a binary step such as 1 pF, 2 pF, 4 pF, . . . and one or a plurality of adjustment capacitors Cd having other capacitances (for example, 10 pF, etc.) may be combined. In addition, it does not mean that a predetermined capacitance is realized with one capacitor. For example, in order to achieve a capacitance of 10 pF, capacitances of 5 pF may be connected in parallel or capacitances of 20 pF may be connected in series.

In addition, the capacitance variation circuit 331 may include a capacitance-invariant capacitor having one end connected to the power supply line 4 and the other end grounded. The drive circuit A1 is connected to each PIN diode D.

In the present embodiment, the fixed capacitor 332 and the inductor 333 are connected in series to the power supply line 4, and the capacitance variation circuit 331 is arranged on the upstream side of the power supply line 4 from them in the impedance adjustment circuit 33, as illustrated in FIG. 6. The connection position between the fixed capacitor 332 and the inductor 333 is not limited to the aforementioned connection. For example, the capacitance variation circuit 331, the fixed capacitor 332, and the inductor 333 have only to be connected in an L-type connection, a π-type connection, a T-type connection and the like.

In the impedance matching device 3 configured as described above, the load-side impedance detected by the impedance detection unit 31 is output to the control circuit 32. Then, the control circuit 32 generates drive signals S1 and /S1 to be input to each drive circuit A1 so that the load-side impedance input to the control circuit 32 becomes a predetermined impedance. The drive signals S1 and /S1 thus generated are respectively input to the switching elements SH and SL of the respective drive circuits A1. As a result, the on-state and the off-state of the PIN diode D to which the drive circuit A1 is connected are switched by the operation described in the first embodiment. Then, a high-frequency current flowing through the power supply line 4 flows through the adjustment capacitor Cd connected to the PIN diode D which becomes in the on-state, the adjustment capacitor Cd becomes effective, and a capacitance obtained by adding the capacitances of the adjustment capacitors Cd becomes the capacitance of the capacitance variation circuit 331. In this manner, the impedance matching device 3 adjusts the capacitance of the capacitance variation circuit 331 by controlling the on-state and the off-state of each PIN diode D, thereby adjusting the load-side impedance.

According to the high-frequency power supply system configured as described above, the PIN diode D is switched between the on-state and the off-state by the drive circuit A1. Thus, as illustrated in the first embodiment, it is possible to suppress deterioration in the reliability of the PIN diode D due to hot switching, such that it is possible to appropriately switch between the on-state and the off-state of the PIN diode D. Therefore, impedance matching by the impedance matching device 3 can be appropriately performed. In addition, since the drive circuit A1 can switch the PIN diode D from the on-state to the off-state with a short transition time, the impedance matching device 3 can adjust the load-side impedance at high speed. Therefore, in the high-frequency power supply system, it is possible to efficiently supply the high-frequency power from the high-frequency power supply 1 to the load 2.

In the high-frequency power supply system according to the fifth embodiment, a case where the impedance matching device 3 detects the load-side impedance by the impedance detection unit 31, and the control circuit 32 controls the impedance adjustment circuit 33 based on the load-side impedance has been described as an example, but the invention is not limited thereto. For example, instead of the impedance detection unit 31, a reflected wave power detection unit for detecting reflected wave power flowing through the power supply line 4 is provided, and the control circuit 32 may control the impedance adjustment circuit 33 so that the reflected wave power becomes low.

In the high-frequency power supply system according to the fifth embodiment, a case where the impedance matching device 3 includes the drive circuit A1 according to the first embodiment has been described as an example, but instead of the drive circuit A1, the drive circuits A2 to A4 according to the second to fourth embodiments may be included. Further, the drive circuits A1 to A4 may be combined.

The drive circuit of the PIN diode according to the present disclosure and the impedance matching device using the drive circuit are not limited to the aforementioned embodiments. The specific configuration of each part of the drive circuit and the impedance matching device of the present disclosure can be variously changed in design.

It is to be noted that, as used herein and in the appended claims, the singular forms "a", "an", and "the" include plural referents unless the context clearly dictates otherwise.

It is to be noted that the disclosed embodiment is illustrative and not restrictive in all aspects. The scope of the present invention is defined by the appended claims rather than by the description preceding them, and all changes that fall within metes and bounds of the claims, or equivalence of such metes and bounds thereof are therefore intended to be embraced by the claims.

The invention claimed is:

1. A drive circuit for switching between an on-state and an off-state of a PIN diode, the drive circuit comprising:
    a first switching element and a second switching element, one of the first switching element and the second switching element being in an off-state when the other is in an on-state;
    a drive power supply that generates a DC voltage; and
    a current-limiting resistor that adjusts a forward current of the PIN diode,
    wherein when the first switching element is in the on-state and the second switching element is in the off-state, a forward voltage is applied from the drive power supply to the PIN diode via the current-limiting resistor to turn on the PIN diode,
    wherein when the first switching element is in the off-state and the second switching element is in the on-state, a reverse voltage is applied not via the current-limiting resistor to the PIN diode from the drive power supply to turn off the PIN diode,
    wherein the current-limiting resistor, the first switching element, and the second switching element are connected in series in an order described, from a positive electrode terminal to a negative electrode terminal of the drive power supply, and
    wherein an anode terminal of the PIN diode is connected to a node between the first switching element and the second switching element and a cathode terminal of the PIN diode is to be grounded.

2. The drive circuit according to claim 1, wherein an on-resistance of the second switching element is 0.1Ω or less.

3. The drive circuit according to claim 1, wherein the forward current of the PIN diode generated by the forward voltage is determined by an on-resistance of the first switching element and the current-limiting resistor, and
    wherein a resistance value of the current-limiting resistor is determined based on the on-resistance of the first switching element so that the forward current of the PIN diode has a predetermined current value.

4. The drive circuit according to claim 1, further comprising a filter circuit connected between the node and the PIN diode.

5. The drive circuit according to claim 1, further comprising a speed-up capacitor connected in parallel to the current-limiting resistor.

6. An impedance matching device to be disposed between a high-frequency power supply and a load connected to each other by a power supply line, the device comprising:
    a plurality of impedance adjustment capacitors connected in parallel and each having one end connected to the power supply line;
    a plurality of PIN diodes connected in series one by one to corresponding ones of the plurality of impedance adjustment capacitors;
    a plurality of drive circuits according to claim 1 respectively connected to corresponding ones of the plurality of PIN diodes;
    a detection unit that detects a load-side impedance seen from an output end of the high-frequency power supply; and
    a control circuit that inputs a drive signal for switching between an on-state and an off-state of the first switching element and the second switching element to each of the plurality of drive circuits based on the load-side impedance.

7. An impedance matching device to be disposed between a high-frequency power supply and a load connected to each other by a power supply line, the device comprising:
    a plurality of impedance adjustment capacitors connected in parallel and each having one end connected to the power supply line;
    a plurality of PIN diodes each having one end connected to the other end of each of the plurality of impedance adjustment capacitors, the other end of each of the plurality of PIN diodes being to be grounded;
    a plurality of drive circuits each including a first switching element and a second switching element, and each having an output terminal connected to the one end of each of the plurality of PIN diodes;
    a detection unit that detects a load-side impedance seen from an output end of the high-frequency power supply;
    a control circuit that inputs a drive signal for switching between an on-state and an off-state of the first switching element and the second switching element to each of the plurality of drive circuits based on the load-side impedance;
    wherein each of the plurality of drive circuits further includes:
    a drive power supply that has a first output terminal and a second output terminal and that generates a DC voltage;
    a current-limiting resistor that adjusts a forward current of the PIN diode when the first switching element is in the on-state;
    a speed-up capacitor connected in parallel to the current-limiting resistor; and
    a filter circuit connected to the output terminal and a node between the first switching element and the second switching element;
    wherein the control circuit gives a drive signal to each of the plurality of drive circuits such that the first switching element is in the on-state and the second switching element is in the off-state, conducting a first current path from the first output terminal of the drive power supply to the output terminal of the drive circuit, applying a forward voltage to the PIN diode to turn on the PIN diode, causing a current determined by an on-resistance of the first switching element and the current-limiting resistor to flow via the first current path, and
    wherein the control circuit gives a drive signal to each of the plurality of drive circuits such that the first switching element is in the off-state and the second switching element is in the on-state, conducting a second current path from the second output terminal of the drive power supply to the output terminal of the drive circuit, applying a reverse voltage to the PIN diode to turn off the PIN diode, causing a current determined by an on-resistance of the second switching element to flow via the second current path.

8. The impedance matching device according to claim 7, wherein
    the first output terminal is a positive electrode terminal of the drive power supply;
    the second output terminal is a negative electrode terminal of the drive power supply;
    the first switching element, the current-limiting resistor, and the second switching element are connected in series in an order described, from the positive electrode terminal to the negative electrode terminal of the drive power supply; and the PIN diode has an anode terminal connected to the impedance adjustment capacitor and a cathode terminal to be grounded.

9. The impedance matching device according to claim 7, wherein
the first output terminal is a positive electrode terminal of the drive power supply;
the second output terminal is a negative electrode terminal of the drive power supply;
the current-limiting resistor, the first switching element, and the second switching element are connected in series in an order described, from the positive electrode terminal to the negative electrode terminal of the drive power supply; and
the PIN diode has an anode terminal connected to the impedance adjustment capacitor and a cathode terminal to be grounded.

10. The impedance matching device according to claim 7, wherein
the first output terminal is a negative electrode terminal of the drive power supply;
the second output terminal is a positive electrode terminal of the drive power supply;
the second switching element, the current-limiting resistor, and the first switching element are connected in series in an order described, from the positive electrode terminal to the negative electrode terminal of the drive power supply; and
the PIN diode has an anode terminal to be grounded and a cathode terminal connected to the impedance adjustment capacitor.

11. The impedance matching device according to claim 7, wherein
the first output terminal is a negative electrode terminal of the drive power supply;
the second output terminal is a positive electrode terminal of the drive power supply;
the second switching element, the first switching element, and the current-limiting resistor are connected in series in an order described, from the positive electrode terminal to the negative electrode terminal of the drive power supply; and
an anode terminal of the PIN diode is to be grounded and a cathode terminal of the PIN diode is connected to the impedance adjustment capacitor.

12. The impedance matching device according to claim 7, wherein a resistance value of the current-limiting resistor is so determined that a current flowing the first current path is a predetermined current value, and
wherein the on-resistance of the second switching element is determined based on a transition time when the PIN diode is switched from the on-state to the off-state.

13. The impedance matching device according to claim 7, wherein the on-resistance of the second switching element is $0.1\Omega$ or less.

14. The impedance matching device according to claim 7, wherein the current flowing the first current path is 1 A or more.

* * * * *